(12) United States Patent
Chen

(10) Patent No.: US 10,996,563 B2
(45) Date of Patent: May 4, 2021

(54) METHOD FOR DETECTING COAGULA ON COATER HEAD AND METHOD FOR FABRICATING OPTICAL DIAPHRAGM

(71) Applicants: CHONGQING HKC OPTOELECTRONICS TECHNOLOGY CO., LTD., Chongqing (CN); HKC CORPORATION LIMITED, Guangdong (CN)

(72) Inventor: Ronglong Chen, Chongqing (CN)

(73) Assignees: CHONGQING HKC OPTOELECTRONICS TECHNOLOGY CO., LTD., Chongqing (CN); HKC CORPORATION LIMITED, Guangdong (CN)

( * ) Notice: Subject to any disclaimer, the term of this patent is extended or adjusted under 35 U.S.C. 154(b) by 94 days.

(21) Appl. No.: 16/338,679

(22) PCT Filed: Oct. 25, 2018

(86) PCT No.: PCT/CN2018/111910
§ 371 (c)(1),
(2) Date: Apr. 1, 2019

(87) PCT Pub. No.: WO2020/052009
PCT Pub. Date: Mar. 19, 2020

(65) Prior Publication Data
US 2020/0089109 A1 Mar. 19, 2020

(30) Foreign Application Priority Data
Sep. 14, 2018 (CN) .......................... 201811072570.6

(51) Int. Cl.
*B05D 3/02* (2006.01)
*G03F 7/00* (2006.01)
(Continued)

(52) U.S. Cl.
CPC ........ *G03F 7/0007* (2013.01); *B05C 11/1005* (2013.01); *B05D 3/007* (2013.01);
(Continued)

(58) Field of Classification Search
CPC ....... B05D 3/007; G01B 7/06; G03F 7/70483; G03F 7/7085
See application file for complete search history.

(56) References Cited

U.S. PATENT DOCUMENTS

| 4,902,603 | A | * | 2/1990 | Slater | ...................... G03F 7/038 |
| | | | | | 430/270.1 |
| 6,170,494 | B1 | * | 1/2001 | Marinaro | .............. B05B 15/555 |
| | | | | | 134/22.18 |

(Continued)

FOREIGN PATENT DOCUMENTS

| CN | 201259416 Y | 6/2009 |
| CN | 101504274 A | 8/2009 |

(Continued)

OTHER PUBLICATIONS

Dektak IIA operation manual retrieved from http://www.sitekprocess.com/objects/catalog/product/extras/ 3394_Dektak%20IIA.pdf retrieved Aug. 27, 2020 (Year: 2020).*

(Continued)

*Primary Examiner* — Nathan H Empie
(74) *Attorney, Agent, or Firm* — Westbridge IP LLC

(57) ABSTRACT

The present application provides a method for detecting coagula on a coater head. The method includes: detecting a thickness value of a coating material (2) on a substrate along a coating direction thereof; acquiring a first thickness value (Continued)

and a second thickness value, and calculating a difference value; and comparing an absolute value of the difference value with a preset value, and outputting a feedback signal if the absolute value of the difference value exceeds the preset value.

11 Claims, 2 Drawing Sheets

(51) Int. Cl.
  *B05D 3/00* (2006.01)
  *G01B 7/06* (2006.01)
  *G03F 7/20* (2006.01)
  *G03F 7/16* (2006.01)
  *B05C 11/10* (2006.01)

(52) U.S. Cl.
  CPC .............. *G01B 7/06* (2013.01); *G03F 7/16* (2013.01); *G03F 7/7085* (2013.01); *G03F 7/70483* (2013.01)

(56) References Cited

U.S. PATENT DOCUMENTS

| | | | |
|---|---|---|---|
| 6,627,378 B1* | 9/2003 | Koh | G03F 7/0045 430/270.1 |
| 2002/0037462 A1* | 3/2002 | Ogata | H01L 21/67253 430/30 |
| 2003/0054668 A1* | 3/2003 | Kitano | H01L 21/67034 438/782 |
| 2008/0233269 A1* | 9/2008 | Carcasi | H01L 21/6715 427/9 |
| 2014/0127625 A1* | 5/2014 | Defranco | G03F 7/09 430/270.1 |
| 2015/0035970 A1* | 2/2015 | Brumbaugh | G01N 21/9054 348/93 |
| 2017/0368796 A1 | 12/2017 | Zhong et al. | |

FOREIGN PATENT DOCUMENTS

| | | | |
|---|---|---|---|
| CN | 102054721 | A | 5/2011 |
| CN | 202802938 | U | 3/2013 |
| CN | 103895346 | A | 7/2014 |
| CN | 104307707 | A | 1/2015 |
| CN | 104344791 | A | 2/2015 |
| CN | 106840052 | A | 6/2017 |
| CN | 106979761 | A | 7/2017 |
| JP | 07168362 | A * | 7/1995 |
| JP | 2007066799 | A * | 3/2007 |

OTHER PUBLICATIONS

Chinese Office Action, dated Apr. 18, 2019, for Chongqing Huike Jinyu Optoelectronic Technology Co., Ltd et al., Application No. 201811072570.6.

International Search Report, dated May 29, 2019, for Chongqing HKC Optoelectronics Technology Co., Ltd., et al., International Application No. PCT/CN2018/111910, Filed Oct. 25, 2018.

* cited by examiner

METHOD FOR DETECTING COAGULA ON COATER HEAD AND METHOD FOR FABRICATING OPTICAL DIAPHRAGM

CROSS-REFERENCE TO RELATED APPLICATIONS

This application is the International Application No. PCT/CN2018/111910 for entry into US national phase with an international filing date of Oct. 25, 2018, designating US, and claims priority to Chinese Patent Application No. 201811072570.6, filed on Sep. 14, 2018, the content of which is incorporated herein by reference in its entirety.

BACKGROUND

Technical Field

The present application relates to the technical field of coater, and more particularly to a method for detecting coagulum on a coater head and a method for fabricating an optical diaphragm.

Description of Related Art

The current coater is mainly used for coating process on a surface of a substrate (such as a baseplate, a diaphragm, and a paper, etc.). It applies a layer of a coating material (such as paint, glue, ink, etc.) with a specific function (such as conductive, insulating, light transmission, etc.) onto a surface of the substrate via a coater head, after curing treatment (such as photocuring treatment, heat curing treatment, etc.) of the layer of the coating material, a final product is enabled to have the specific function of the coating material. The coater head of the coating machine has may types, such as a brush type, an air knife type, a scrapper type, a roller type, and a nozzle type. During the working of the coater, some the coating materials are inevitably attached to the coater head, as moisture in the coating material attached to the coater head continuously evaporates, hard coagula occur on the coater head, the coagula may block the coater head and may further affect the discharge effect of the coater head, which further results in uneven thickness of the coating material coated on the surface of the substrate and affects the performance of the products. Thus, the coater head of the coater is required to be periodically cleaned to remove the coagula and avoid the blocking of the coater head. In the exemplary art, the adhesion of the coagula on the coater head is usually periodically checked by human, which has low efficiency, particularly, it is more difficult to check by human when the coater head is installed inside the coater.

An optical filter is generally formed by applying a photoresist to a substrate, and performing a process such as exposure, development, and baking to form a pattern. After long time work of the coating machine, some photoresist will be coagulated on the coater head. When the coagulated photoresist is excessive, the coater head will be blocked, which will affect the coating effect of the coater head, make the thickness of a photoresist membrane relatively small, and finally result in unqualified thickness and uneven brightness of the photoresist membrane of produced optical filter.

BRIEF SUMMARY OF THE INVENTION

It is an object of the present application to provide a method for detecting coagulum on a coater head in order to solve the technical problem that the human check of the coagula attachment on the coater head of the coater is inconvenient and inefficient.

It is another object of the present application to provide a method for fabricating an optical diaphragm in order to solve the technical problem of uneven brightness caused by unqualified thickness of the optical diaphragm.

In order to achieve the above objects, the present application adopts the following technical solutions: a first aspect provides a method for detecting coagulum on a coater head, and the method comprises:

detecting a thickness value of a coating material on a substrate along a coating direction thereof;

acquiring a first thickness value at a first position and a second thickness value at a second position of the coating material along the coating direction, wherein the second position is different from the first position, and calculating a difference value between the first thickness value and the second thickness value; and comparing an absolute value of the difference value with a preset value, and outputting a feedback signal if the absolute value of the difference value exceeds the preset value.

In one embodiment, the step of detecting the thickness value of the coating material on the substrate along the coating direction thereof comprises:

abutting a probe on the coating material and causing the probe to slide along the coating direction;

outputting a voltage signal indicating the thickness of the coating material, through a transformer in connection with the probe during the sliding of the probe; and obtaining the thickness value of the coating material along the coating direction according to the voltage signal.

In one embodiment, the step of detecting the thickness value of the coating material on the substrate along the coating direction thereof comprises:

placing an ultrasonic probe of an ultrasonic detector above the coating material on the substrate, and causing the ultrasonic probe to move along the coating direction;

transmitting an ultrasonic wave to the coating material on the substrate during the movement of the ultrasonic probe, receiving a reflected ultrasonic wave by a receiver of the ultrasonic detector, and outputting a time signal by the ultrasonic detector according to a reflection time of the ultrasonic wave; and obtaining the thickness value of the coating material along the coating direction according to the time signal.

In one embodiment, after obtaining the thickness value of the coating material along the coating direction, the method further comprises:

plotting a detection curve representative of the thickness of the coating material along the coating direction according to the thickness value.

In one embodiment, the feedback signal is output to the coater and the coater is controlled to stop operation.

A second aspect provides a method for fabricating an optical diaphragm, and the method comprises applying a coating material to a surface of a substrate along the coating direction;

performing a first curing treatment on the coating material on the surface of the substrate;

detecting a thickness value of the coating material on the substrate along the coating direction;

acquiring a first thickness value at a first position and a second thickness value at a second position of the coating material along the coating direction, wherein the second position is different from the first position, and calculating a difference value between the first thickness value and the second thickness value; and comparing an absolute value of the difference value with a preset value; outputting a feedback signal and cleaning the coagula on the coater head of the coater if the absolute value of the difference value exceeds the preset value; or exposing and developing the coating material and performing a second curing treatment on the coating material if the absolute value of the difference value does not exceed the preset value.

In one embodiment, the step of detecting the thickness value of the coating material on the substrate along the coating direction thereof comprises:

abutting the probe on the coating material and causing the probe to slide along the coating direction;

outputting a voltage signal indicating the thickness of the coating material, through a transformer in connection with the probe during the sliding of the probe; and obtaining the thickness value of the coating material along the coating direction according to the voltage signal.

In one embodiment, the step of detecting the thickness value of the coating material on the substrate along the coating direction thereof comprises:

placing an ultrasonic probe of an ultrasonic detector above the coating material on the substrate, and causing the ultrasonic probe to move along the coating direction;

transmitting an ultrasonic wave to the coating material on the substrate during the movement of the ultrasonic probe, receiving a reflected ultrasonic wave by a receiver of the ultrasonic detector, and outputting a time signal by the ultrasonic detector according to a reflection time of the ultrasonic wave; and obtaining the thickness value of the coating material along the coating direction according to the time signal.

In one embodiment, in the step of acquiring the first thickness value at the first position and the second thickness value at the second position of the coating material along the coating direction, wherein the second position is different from the first position, and calculating the difference value between the first thickness value and the second thickness value, a distance between the first position and the second position along the coating direction does not exceed 10 mm.

In one embodiment, in the step of acquiring the first thickness value at the first position and the second thickness value at the second position of the coating material along the coating direction, wherein the second position is different from the first position, and calculating the difference value between the first thickness value and the second thickness value, a distance between the first position and the second position along the coating direction does not exceed 5 mm.

In one embodiment, the preset value is set to be 0.05 μm.

In one embodiment, the step of cleaning the coagula on the coater head of the coater comprises immersing the coater head into a cleaning solution for ultrasonic cleaning.

In one embodiment, the cleaning solution adopts a propylene glycol methyl ether acetate solution.

In one embodiment, the step of cleaning the coagula on the coater head of the coater is conducted during a shutdown status of the coater; after the cleaning of the coagula on the coater head is completed, the coater is restarted, and the substrate after being cleaned is re-fed into the step of applying the coating material to the surface of the substrate along the coating direction.

In one embodiment, in the step of cleaning the coagula on the coater head of the coater, the coating material on the substrate is cleaned by a developing solution or a photoresist stripping solution, after the cleaning of the coagula on the coater head is completed, the coater is restarted, and the substrate after being cleaned is re-fed into the step of applying the coating material to the surface of the substrate along the coating direction.

In one embodiment, the step of exposing and developing the coating material and performing the second curing treatment on the coating material comprises:

exposing the coating material on the substrate;

developing the coating material on the substrate; and performing the second curing treatment on the coating material on the surface of the substrate.

In one embodiment, wherein the coating material is a photoresist.

In one embodiment, in the step of performing the first curing treatment on the coating material on the surface of the substrate, an oven is adopted to pre-bake and dry the substrate coated with the coating material to remove 80% solvent from the photoresist.

In one embodiment, in the step of subjecting the coating material on the surface of the substrate to the second curing treatment, the coating material on the surface of the substrate is completely cured.

In the method for detecting coagula on the coater head provided by the present application, the thickness change of the coating material on the substrate along the coating direction is monitored, which indirectly reflects the attachment of the coagula and blocking condition of the coater head. The feedback signal may be automatically output in abnormal condition to remind workers to clean the coagula on the coater head, and there is no need for periodically detecting of the coater head by human, thus the working efficiency is improved. In particular, when the coater head is installed in unobservable positions inside the coater, the coater can be prevented from being disassembled frequently to periodically observe the coater head, therefore it is easier to detect and clean the coater head.

The method for fabricating the optical diaphragm provided by the present application adopts the above detection method for the coagula on the coater head, thus. During the production process of the optical diaphragm, the fabrication method can automatically judge whether the coater head of the coater is attached with excessive coagula resulting in blocking of the coater head, control the coater to stop operation, and timely detect the optical diaphragm with unqualified thickness and uneven brightness, thus improving the yield of the optical diaphragm.

BRIEF DESCRIPTION OF THE DRAWINGS

In order to more clearly illustrate the technical solutions in the embodiments of the present application, the drawings used in the embodiments or the prior art description will be briefly described hereinbelow. Obviously, the drawings in the following description are only some embodiments of the present application. Other drawings may be obtained from those having ordinary skill in the art without departing from the scope of the invention.

Figure 1:
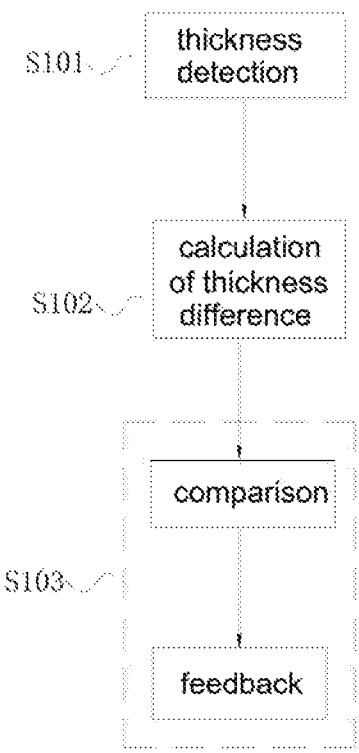
FIG. 1 is a flow chart of a method for detecting coagula on a coating head according to one embodiment of the present application.

Among them, the following reference numerals in the figure are used:

1. Substrate; 2. Coating material; 3. Probe; 4. Lever mechanism; 5. Connecting mechanism; and 6. Transformer.

DETAILED DESCRIPTION

In order to make the technical problems to be solved, technical solutions, and beneficial effects of the present application more clear, the present application will be further described in detail hereinbelow with reference to the accompanying drawings and embodiments. It should be understood that the specific embodiments described herein are merely intended to explain the application rather than to limit the present application.

It should be noted that when an element is referred to as being "fixed" or "arranged" at/in/on another element, it can be directly at/in/on the other element. When an element is referred to as being "connected" to/with another element, it can be directly or indirectly connected to/with the other element.

It should be understood that terms "length", "width", "upper", "lower", "front", "rear", "left", "right", "vertical", "horizontal", "top", "bottom", "inside", "outside" and the like indicating orientation or positional relationship are based on the orientation or the positional relationship shown in the drawings, and are merely for facilitating and simplifying the description of the present application, rather than indicating or implying that a device or component must have a particular orientation, or be configured or operated in a particular orientation, and thus should not be construed as limiting the application.

Moreover, the terms "first" and "second" are adopted for descriptive purposes only and are not to be construed as indicating or implying a relative importance or implicitly indicating the number of technical features indicated. Thus, features defining "first" and "second" may include one or more of the features either explicitly or implicitly. In the description of the present application, the meaning of "a plurality of" or "multiple" is two or more unless otherwise specifically defined.

Figure 2:
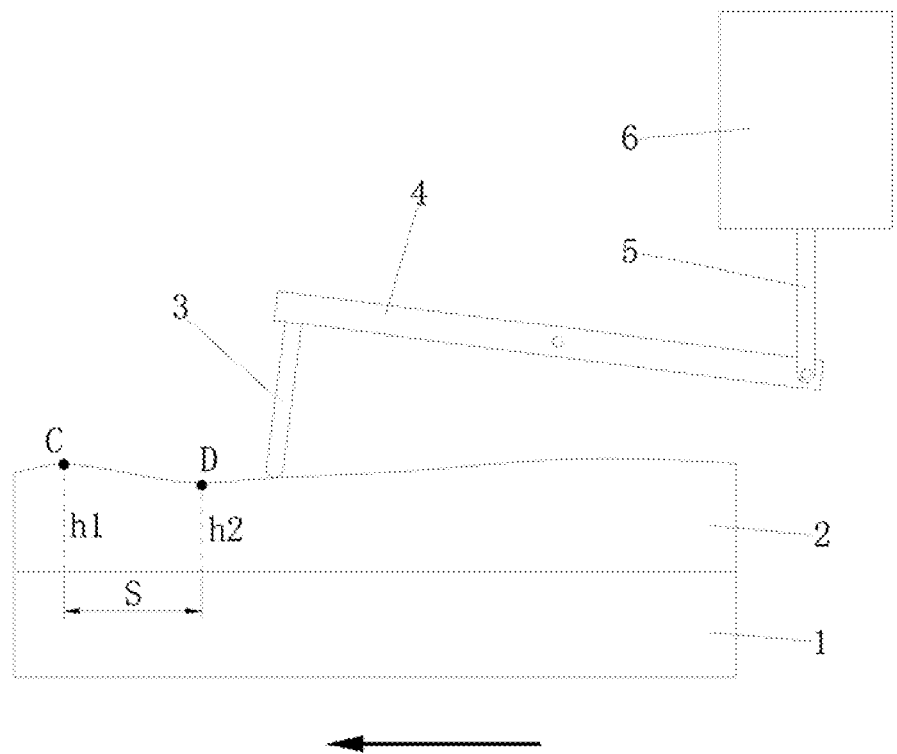
FIG. 2 is a schematic view showing a thickness of a coating material detected by a film detector according to one embodiment of the present application.

One embodiment provides a method for detecting coagula on a coating head, as shown in FIGS. 1-2, the method is employed to automatically determine whether the coater head of the coater is attached with excessive coagula resulting in blocking of the coater head, and the method comprises the following steps:

Step S101: thickness detection: detecting a thickness value h of each position of a coating material 2 on a substrate 1 along a coating direction thereof.

Step S102: calculation of thickness difference: acquiring a first thickness value h1 of a first position and a second thickness value h2 of a second position of the coating material 2 along the coating direction, in which the second position is different from the first position, and calculating a difference value H between the first thickness value h1 and the second thickness value h2.

Step S103: comparison and feedback: comparing an absolute value of the difference value H with a preset value X, and outputting a feedback signal indicating excessive coagula on the coater head when the absolute value of the difference value H exceeds the preset value X.

During working process of the coater, more and more coagula are coagulated on the coater head, which will block the coater head and result in unstable quantity of the coating material on the coater head (that is, a discharge volume of the coating material 2 on the coater head in a time unit), usually, the quantity of the coating material will decrease, the thickness of the coating material 2 at corresponding position of the substrate 1 will also decrease, such that the absolute value of the difference value H between the thickness at such position and the thickness of other positions increases, and the uniformity of the coating material 2 decreases. Based on the above four steps, the thickness value h of each position of the coating material 2 on the substrate 1 along the coating direction can be detected, a difference value H between thicknesses of two positions of the coating material 2 in the coating direction is calculated, and the absolute value of the difference value H is compared with the preset value X which is set in advance and representative of an allowable thickness change range of the coating material 2 along the coating direction. When the absolute value of the difference value H exceeds the preset value X, it is indicated that the thickness change of the coating material 2 in the coating direction is abnormal, and the absolute value of the difference value H between the thicknesses of two positions of the coating material 2 in the coating direction is too large, in such case, a feedback signal is output to remind the workers to clean the coagula on the coater head of the coater timely.

In the method for detecting coagula on the coater head provided by the present embodiment, the thickness change of the coating material 2 on the substrate 1 along the coating direction is monitored (if the absolute value of the difference value H does not exceed the preset value X, the thickness change is normal; and if the difference value H exceeds the preset value X, the thickness change is abnormal), which indirectly reflects the attachment of the coagula and blocking condition of the coater head. The feedback signal may be automatically output in abnormal condition to remind the workers to clean the coagula on the coater head, and there is no need for periodically detecting of the coater head by human, thus the working efficiency is improved. In particular, when the coater head is installed in unobservable positions inside the coater, the coater can be prevented from being disassembled frequently to periodically observe the coater head, therefore it is easier to detect and clean the coater head.

The above steps will be described in detail hereinbelow with reference to the accompanying drawings.

In step S101, because the coating material 2 applied to the substrate 1 generally presents a film, a film detector can be adopted to detect the thickness value h of each position of the coating material 2 along the coating direction. In particular, as shown in FIG. 2, the film detector comprises: a probe 3, a lever mechanism 4, and a transformer 6, in which, the transformer 6 can be a differential transformer. The probe 3 is in fixed connection with one end of the lever mechanism 4, the other end of the lever mechanism 4 is in hinge connection with a connecting rod 5, and a free end of the connecting rod is in connection with the transformer 6. During work, a tip of the probe 3 is in abut connection with the coating material 2 on the substrate 1, the substrate 1 is conveyed in a conveying direction (the direction as indicated by an arrow of FIG. 2), the conveying direction is consistent to the coating direction of the coating material 2 on the substrate 1, such that the tip of the probe 3 slides in the coating direction of the coating material 2. During the sliding process of the probe 3, the thickness change of the coating material 2 along the coating direction will cause the lever mechanism 4 to move correspondingly, thereby causing a corresponding change in displacement or pressure of the connecting rod 5 relative to the transformer 6. The amount of change in the displacement or pressure causes the transformer 6 to output a voltage signal, the magnitude of which changes along with the thickness change of the coating material 2 along the coating direction. The voltage signal is converted into a digital signal via an analog-to-digital converter and the digital signal is output to the computer, and the computer can output the thickness value h of each position of the coating material along the coating direction according to the digital signal.

In other embodiments, the thickness value h of each position of the coating material 2 along the coating direction can be detected by other means. For example, the ultrasonic detector can be adopted, that is, an ultrasonic probe of the ultrasonic detector is placed above the coating material 2 on the substrate 1, and the substrate 1 is conveyed in a conveying direction which is consistent to the coating direction of coating material 2 on the substrate 1, such that the ultrasonic probe is caused to move along the coating direction of the coating material 2. During the moving process of the ultrasonic probe, an ultrasonic wave is transmitted to the coating material 2 on the substrate 1 by the ultrasonic probe, and at the same time, a reflected ultrasonic wave is received by a receiver of the ultrasonic detector. The reflection time of the ultrasonic wave changes along with the thickness change of the coating material 2 along the coating direction, which makes the ultrasonic detector output a time signal, and the magnitude of time signal changes along with the thickness change of the coating material 2 along the coating direction. The time signal is converted into the digital signal by the analog-to-digital converter and output to the computer, and the thickness value h of each position of the coating material 2 along the coating direction can be output by the computer.

In one embodiment, after the thickness value h of each position of the coating material 2 along the coating direction is obtained through the detection step, the thickness value h of each position of the coating material 2 along the coating direction can be input to the computer. A detection curve for indicating the thickness of the coating material along the coating direction is plotted by the computer according to the thickness value h of each position of the coating material along the coating direction, thus it is convenient for the workers to observe the changes of the coating material 2 on the substrate 1 along the coating direction and to know the coagula attachment on the coater head of the coater at any time by the detection curve.

In step S102, the first thickness value h1 of the first position (that is, the position indicated by the point C of FIG. 2) and the second thickness value h2 of the second position (that is, the position indicated by the point C of FIG. 2) of the coating material along the coating direction are acquired by the computer, and the difference value H between the first thickness value h1 and the second thickness value h2 is calculated.

Figure 3:
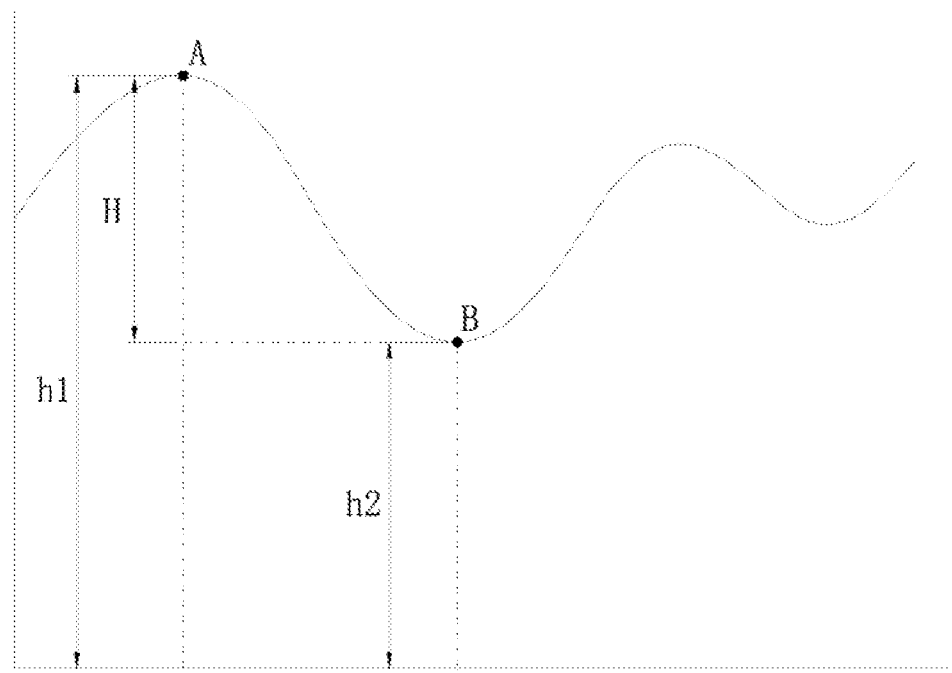
FIG. 3 is a flowchart of a method for fabricating an optical diaphragm according to one embodiment of the present application.

FIG. 3 shows a detection curve plotted by the computer according to the above-described detection step, a horizontal axis is representative of the respective position of the coating material 2 along the coating direction, and a vertical axis is representative of the thickness of the corresponding position of the coating material 2 along the coating direction. The points A and B on the detection curve respectively correspond to points C and D in FIG. 2, that is, as indicated by the computer, the thickness corresponds to the point C is the first thickness value h1, and the thickness corresponds to the point D is the second thickness value h2.

In step S103, the absolute value of the difference value H obtained through the calculation step is compared with the preset value X, which is set in advance, by a comparator. If the difference value H exceeds the preset value X, the feedback signal indicating excessive coagula on the coater head is output by the computer.

The feedback signal can be transmitted in the form of a signal, such as an optical signal, an acoustic signal, or a shutdown signal. For example, the feedback signal is output to an indicator light of the coater by a computer to cause the indicator light to flash to remind the workers to clean the coagula on the coater head in time. For another example, the feedback signal is output to a loudspeaker on the coater by the computer to cause the loudspeaker to produce a sound to remind the workers to clean the coagula on the coater head in time; and for sill another example, the feedback signal is output to the coater by the computer to control the coater to stop operation, and the coater is prevented from continuing to operate in the case of excessive coagula on the coater head. When the workers observe the shutdown of the coater, they will check the coagula on the coater head, and restart the coater after cleaning of the coater head.

Optionally, the feedback signal is provided to the workers in the form of the shutdown signal and output to the coater, and the coater is controlled to stop operation. Not only can the workers be reminded to clean the coagula on the coater head in time, but also the coater is prevented from continuous working or producing unqualified products in the case of excessive coagula on the coater head.

Figure 4:
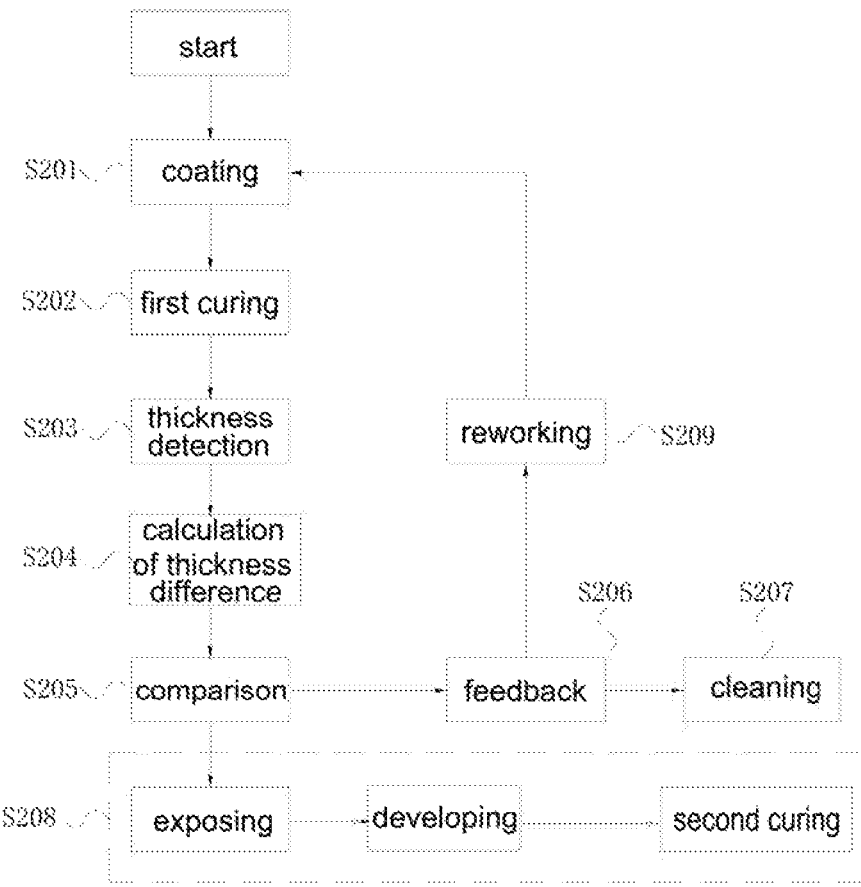
FIG. 4 is a schematic diagram of a detection curve according to one embodiment of the present application.

Another embodiment also provides a method for fabricating the optical diaphragm. As shown in FIG. 4, the method can be applied to produce multiple types of optical diaphragms, including color filters, diffusers, and reflectors, that need to be coated with a film. The method includes the following steps:

Step S201, coating: coating a surface of a substrate 1 with a coating material 2 along the coating direction.

Step S202, first curing: performing a first curing treatment on the coating material 2 on the surface of the substrate 1.

Step S203, thickness detection: detecting a thickness value h of each position of the coating material 2 on the substrate 1 along the coating direction.

Step S204, calculation of thickness difference: acquiring a first thickness value h1 of a first position and a second thickness value h2 of a second position of the coating material 2 along the coating direction, in which the second position is different from the first position, and calculating a difference value H between the first thickness value h1 and the second thickness value h2; and Step S205, comparison: comparing an absolute value of the difference value H with a preset value X; performing the following step S206 and step S207 when the absolute value of the difference value H exceeds the preset value X, and performing step S208 when the absolute value of the difference value H does not exceed the preset value X.

Step S206, feedback: outputting a feedback signal. In this step, the feedback signal can be transmitted in the form of an optical signal, an acoustic signal, a shutdown signal, etc., to remind the workers to carry out corresponding processing.

Step S207, cleaning: cleaning the coagula on the coater head of the coater.

Step S208: exposing and developing the coating material and performing a second curing treatment on the coating material.

The method for fabricating the optical diaphragm provided by the present embodiment can automatically judge whether the coater head of the coater is attached with excessive coagula resulting in blocking of the coater head, control the coater to stop operation, and timely detect the optical diaphragm with unqualified thickness and uneven brightness, thus enabling the workers to timely clean the coater head and improving the yield of the optical diaphragm.

The above steps are described in detail hereinbelow with reference to the accompanying drawings.

In step S201, the coating material 2 is applied to the surface of the substrate 1 along the coating direction by the coater, and the coating material 2 is a photoresist.

In step S202, the substrate 1 coated with the coating material 2 is pre-baked by an oven, and is required to be dried to remove 80% of the solvent from the photoresist, so that the coating material 2 is cured to a certain extent to prevent the probe 3 from scratching the coating material 2 on the surface of the substrate 1 during the detection step.

In step S203, a film detector can be adopted to detect the thickness value h of each position of the coating material 2 along the coating direction. In particular, as shown in FIG. 2, the film detector comprises: a probe 3, a lever mechanism 4, and a transformer 6. The probe 3 is in fixed connection with one end of the lever mechanism 4, the other end of the lever mechanism 4 is in hinge connection with a connecting rod 5, and a free end of the connecting rod is in connection with the transformer 6. During work, a tip of the probe 3 is in abut connection with the coating material 2 on the substrate 1, the substrate 1 is conveyed in a conveying direction (the direction as indicated by an arrow of FIG. 2), the conveying direction is consistent to the coating direction of the coating material 2 on the substrate 1, such that the tip of the probe 3 slides in the coating direction of the coating material 2. During the sliding process of the probe 3, the thickness change of the coating material 2 along the coating direction will cause the lever mechanism 4 to move correspondingly, thereby causing a corresponding change in displacement or pressure of the connecting rod 5 relative to the transformer 6. The amount of change in the displacement or pressure causes the transformer 6 to output a voltage signal, the magnitude of which changes along with the thickness change of the coating material 2 along the coating direction. The voltage signal is converted into a digital signal via an analog-to-digital converter and the digital signal is output to the computer, and the computer can output the thickness value h of each position of the coating material along the coating direction according to the digital signal.

In other embodiments, the thickness value h of each position of the coating material 2 along the coating direction can be detected by other means. For example, the ultrasonic detector can be adopted, that is, an ultrasonic probe of the ultrasonic detector is placed above the coating material 2 on the substrate 1, and the substrate 1 is conveyed in a conveying direction which is consistent to the coating direction of coating material 2 on the substrate 1, such that the ultrasonic probe is caused to move along the coating direction of the coating material 2. During the moving process of the ultrasonic probe, an ultrasonic wave is transmitted to the coating material 2 on the substrate 1 by the ultrasonic probe, and at the same time, a reflected ultrasonic wave is received by a receiver of the ultrasonic detector. The reflection time of the ultrasonic wave changes along with the thickness change of the coating material 2 along the coating direction, which makes the ultrasonic detector output a time signal, and the magnitude of time signal changes along with the thickness change of the coating material 2 along the coating direction. The time signal is converted into the digital signal by the analog-to-digital converter and output to the computer, and the thickness value h of each position of the coating material 2 along the coating direction can be output by the computer.

In another embodiment, after the thickness value h of each position of the coating material 2 along the coating direction is obtained through the detection step, the thickness value h of each position of the coating material 2 along the coating direction can be input to the computer. A detection curve for indicating the thickness of the coating material along the coating direction is plotted by the computer according to the thickness value h of each position of the coating material along the coating direction, thus it is convenient for the workers to observe the changes of the coating material 2 on the substrate 1 along the coating direction and to know the coagula attachment on the coater head of the coater by the detection curve at any time.

In step S204, the first thickness value h1 of the first position (that is, the position indicated by the point C of FIG. 2) and the second thickness value h2 of the second position (that is, the position indicated by the point C of FIG. 2) of the coating material along the coating direction are acquired by the computer, and the difference value H between the first thickness value h1 and the second thickness value h2 is calculated.

FIG. 3 shows a detection curve plotted by the computer according to the above-described detection step, a horizontal axis is representative of the respective position of the coating material 2 along the coating direction, and a vertical axis is representative of the thickness of the corresponding position of the coating material 2 along the coating direction. The points A and B on the detection curve respectively correspond to points C and D in FIG. 2, that is, as indicated by the computer, the thickness corresponds to the point C is the first thickness value h1, and the thickness corresponds to the point D is the second thickness value h2.

Optionally, in the calculation step, the distance between the first position and the second position along the coating direction (ie, S in FIG. 2) is no more than 10 mm, and more optionally, no more than 5 mm. The closer the first position is to the second position, the poorer the brightness uniformity of the produced optical diaphragm is when the absolute value of the generated difference value H exceeds the preset value X. By controlling the distance between the first position and the second position along the coating direction within a range of no more than 10 mm, the two positions of the coating material 2 along the coating direction that are to be calculated and compared are much closer, and the brightness of the optical diaphragm is much uniform within a local smaller range. In another word, as long as that the absolute value of the difference value H between thicknesses of two positions of coating material on the optical diaphragm within a relatively small range does not exceeds the preset value X, the brightness uniformity of the optical diaphragm as a whole is acceptable. Moreover, during the practical production process, because the blocking of the coater head by the coagula has relatively little influence on the thickness of the coating material 2 in the coating direction, if the distance between two positions, corresponding to the two calculation points, of the coating material along the coating direction is too large, it may not be a problem of coating uniformity caused by the blocking of the coater head by the coagula, in that case, other faults of the coater should be checked.

In step S205, the absolute value of the difference value H obtained by step S204 is compared with the preset value X set in advance by the comparator. The preset value X is representative of the allowable thickness change range of the coating material 2 along the coating direction, and the specific value of the preset value X can be determined according to the surface precision of the film layer of the optical diaphragm. In general, the preset value X is set to 0.05 μm. The film layer of the optical diaphragm produced has a high surface precision, and the optical diaphragm has better brightness uniformity.

In step S206, a feedback signal is output to the coater by the computer and the coater is controlled to stop operation.

In step S207, the coater head can be immersed in a cleaning solution for ultrasonic cleaning to improve the cleaning effect on the coater head. The cleaning solution can adopt a propylene glycol methyl ether acetate solution to further improve the cleaning effect on the coater head.

In one embodiment, if the absolute value of the difference value H exceeds the preset value X, then after step S207, the following step S209 is also included:

Step S209, reworking: washing the coating material 2 on the substrate 1, drying the substrate 1, after the coagula on the coater head is cleaned, restarting the coater, and causing the substrate 1 to re-enter the step S201.

In step S209, the coater may be stopped for a period of time, the optical diaphragms in steps S201, S202, and S203 are collected, the coating material 2 on the respective substrate 1 is washed, and the substrate is re-introduced into the coating step for production after the coater is started. Because the coating material 2 on the substrate 1 is not completely cured in the first curing step, the coating material 2 can be easily washed away from the substrate 1. Optionally, the coating material 2 on the substrate 1 may be cleaned using a developer or a photoresist stripping solution, the developer may be used to clean a negative photoresist in the coating material 2, and the photoresist film solution may be used to clean a positive photoresist in coating material 2. In addition, step S209 may be performed simultaneously with step S207 or at different times, but the reworking step and the cleaning step are performed after the feedback step.

In one embodiment, if the absolute value of the difference value H does not exceed the preset value X, it indicates that the thickness change of the coating material 2 along the coating direction is acceptable, and step S208 can be performed, that is, exposing and developing the coating material and performing a second curing treatment on the coating material to further complete the production of the optical diaphragm, and step S208 includes:

exposure: exposing the coating material 2 on the substrate 1.

development: developing the coating material 2 on the substrate 1.

second curing: subjecting the coating material 2 on the surface of the substrate 1 to a second curing treatment, where the coating material on the surface of the substrate 1 is required to be completely cured.

Through the above steps, the optical diaphragm having a flat surface and a uniform thickness can be obtained. Through the above method, the thickness of the coating material can be monitored in real time during the fabricating process of the optical diaphragm, and the substrate being coated unevenly can be processed in time to improve the production efficiency and the processing precision.

The above description is only the optional embodiments of the present application, and is not intended to limit the present application. Any modifications, equivalent substitutions, and improvements made within the spirit and principles of the present application are included in the protection scope of the present application.

What is claimed is:

1. A method for fabricating an optical diaphragm, comprising:
    applying a coating material to a surface of a substrate along a coating direction, wherein the coating material is a photoresist;
    performing a first curing treatment on the coating material on the surface of the substrate;
    detecting a thickness value of the coating material on the substrate along the coating direction;
    acquiring a first thickness value at a first position and a second thickness value at a second position of the coating material along the coating direction, wherein the second position is different from the first position, and calculating a difference value between the first thickness value and the second thickness value; and
    comparing an absolute value of the difference value with a preset value; outputting a feedback signal and cleaning a coagula on a coater head of a coater if the absolute value of the difference value exceeds the preset value; or exposing and developing the coating material and performing a second curing treatment on the coating material if the absolute value of the difference value does not exceed the preset value;
    wherein in the step of performing a first curing treatment on the coating material on the surface of the substrate, an oven is adopted to pre-bake and dry the substrate coated with the coating material to remove 80% solvent from the photoresist; and
    wherein in the step of performing a second curing treatment on the coating material, the coating material on the surface of the substrate is completely cured.

2. The method of claim 1, wherein the step of detecting the thickness value of the coating material on the substrate along the coating direction thereof comprises:
    abutting a probe on the coating material and causing the probe to slide along the coating direction;
    outputting a voltage signal indicating the thickness of the coating material, through a transformer in connection with the probe during the sliding of the probe; and
    obtaining the thickness value of the coating material along the coating direction according to the voltage signal.

3. The method of claim 1, wherein the step of detecting the thickness value of the coating material on the substrate along the coating direction thereof comprises:
    placing an ultrasonic probe of an ultrasonic detector above the coating material on the substrate, and causing the ultrasonic probe to move along the coating direction;
    transmitting an ultrasonic wave to the coating material on the substrate during the movement of the ultrasonic probe, receiving a reflected ultrasonic wave by a receiver of the ultrasonic detector, and outputting a time signal by the ultrasonic detector according to a reflection time of the ultrasonic wave; and
    obtaining the thickness value of the coating material along the coating direction according to the time signal.

4. The method of claim 1, wherein
    in the step of acquiring the first thickness value at the first position and the second thickness value at the second position of the coating material along the coating direction, wherein the second position is different from the first position, and calculating the difference value between the first thickness value and the second thickness value, a distance between the first position and the second position along the coating direction does not exceed 10 mm.

5. The method of claim 1, wherein in the step of acquiring the first thickness value at the first position and the second thickness value at the second position of the coating material along the coating direction, wherein the second position is different from the first position, and calculating the difference value between the first thickness value and the second thickness value, a distance between the first position and the second position along the coating direction does not exceed 5 mm.

6. The method of claim 1, wherein the preset value is set to be 0.05 μm.

7. The method of claim 1, wherein the step of cleaning the coagula on the coater head of the coater comprises immersing the coater head into a cleaning solution for ultrasonic cleaning.

8. The method of claim 7, wherein the cleaning solution adopts a propylene glycol methyl ether acetate solution.

9. The method of claim 1, wherein the step of cleaning the coagula on the coater head of the coater is conducted during a shutdown status of the coater; after the cleaning of the coagula on the coater head is completed, the coater is restarted, and the substrate after being cleaned is re-fed into the step of applying the coating material to the surface of the substrate along the coating direction.

10. The method for fabricating the optical diaphragm of claim 1, wherein in the step of cleaning the coagula on the coater head of the coater, the coating material on the substrate is cleaned by a developing solution or a photoresist stripping solution, after the cleaning of the coagula on the coater head is completed, the coater is restarted, and the substrate after being cleaned is re-fed into the step of applying the coating material to the surface of the substrate along the coating direction.

11. The method of claim 1, wherein the step of exposing and developing the coating material and performing the second curing treatment on the coating material comprises:
    exposing the coating material on the substrate;
    developing the coating material on the substrate; and
    performing the second curing treatment on the coating material on the surface of the substrate.

\* \* \* \* \*